(12) United States Patent
Shiomoto

(10) Patent No.: US 6,996,143 B2
(45) Date of Patent: Feb. 7, 2006

(54) SEMICONDUCTOR LASER DEVICE

(75) Inventor: Takehiro Shiomoto, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 151 days.

(21) Appl. No.: 10/410,304

(22) Filed: Apr. 10, 2003

(65) Prior Publication Data

US 2003/0193976 A1  Oct. 16, 2003

(30) Foreign Application Priority Data

Apr. 12, 2002 (JP) .............................. 2002-110431

(51) Int. Cl.
*H01S 3/04* (2006.01)
*H01S 5/00* (2006.01)
(52) U.S. Cl. .......................................... 372/36; 372/43
(58) Field of Classification Search ................ 372/43, 372/38.02, 32, 34–36, 75; 356/401; 257/675, 257/791
See application file for complete search history.

(56) References Cited

U.S. PATENT DOCUMENTS

| 5,459,573 | A | * | 10/1995 | Abe et al. | .................. | 356/401 |
| 6,181,720 | B1 | * | 1/2001 | Kanemoto et al. | ............ | 372/43 |
| 2003/0128725 | A1 | * | 7/2003 | Roddy et al. | ................. | 372/32 |

FOREIGN PATENT DOCUMENTS

JP  2001-111152  4/2001

\* cited by examiner

*Primary Examiner*—Thuy V. Tran
*Assistant Examiner*—Hung Tran Vy
(74) *Attorney, Agent, or Firm*—Morrison & Foerster LLP

(57) ABSTRACT

A semiconductor laser device has a laser chip, a stem having a block portion on which the laser chip is mounted, and a cap mounted on the stem so as to cover the block portion. The cap has a cutout portion into which the block portion is partially inserted. With this arrangement, the block portion is enlarged, so that the block portion is easily formed integrally with the stem to reduce the manufacturing cost of the stem, and that heat release is increased to improve operating lifetime and the temperature characteristic of the laser element.

10 Claims, 2 Drawing Sheets

SEMICONDUCTOR LASER DEVICE

BACKGROUND OF THE INVENTION

The present invention relates to a semiconductor laser device.

Conventionally, there has been a can package type semiconductor laser device as shown in FIG. 4. The semiconductor laser device of FIG. 4 has a two-body structure of a stem 102 and a cap 104. The stem 102 has a block portion 103 on which a laser chip 101 is mounted. This block portion 103 serves as a base on which the laser chip 101 is mounted and concurrently plays the role of efficiently transmitting heat generated from the laser chip 101 to the main body of the stem 102 during operating. Moreover, a laser beam emitted from the laser chip 101 goes out via a window 104c of the cap 104. A windowpane 108 is attached to the window 104c.

In recent years, owing to the trend toward thickness reduction of optical disk drives, optical pickup devices have been required to have a thin configuration, and semiconductor laser devices have been required to be compacted. In concrete, the standard size of packages of the semiconductor laser devices is 5.6 millimeters in diameter at present, but further reduction thereof is required up to 3.5 millimeters or less in diameter.

If the package size is simply reduced so as to downsize the package, the block portion 103 on which the laser chip 101 is mounted becomes elongated as shown in the prior art example of FIG. 4. The reason why the block portion 103 becomes elongated as follows.

In coping with the recent demand for speeding up optical disk drives for write, the laser power has been required to have a high output. In response to this, the size of the laser chip 101 is set to about 0.8 millimeters or more. This is for a reduction in current density and an improvement in heat radiation. Then, the block portion 103 of the stem 102 is required to have a length of 1.0 millimeter or more so as to secure a radius between a lower portion of the block portion 103 and the stem 102. Furthermore, the block portion 103 has the elongated configuration so that the block portion 103 and the cap portion 104 do not interfere with each other.

However, in the aforementioned conventional semiconductor laser device, it is extremely difficult to make the stem by forging since the block portion 103 is elongated. Therefore, it is required to braze the block portion 103 made of for example copper to the stem 102. This causes an disadvantage that the manufacturing cost of the stem 102 increases.

Moreover, when the block portion 103 becomes elongated, heat radiation is worsened, which results in disadvantageous rise in temperature of the laser chip 101 during operation. Consequently, the operating lifetime and the temperature characteristic of the laser chip 101 is deteriorated.

SUMMARY OF THE INVENTION

An object of the present invention is to provide a semiconductor laser device capable of preventing deterioration in the operating lifetime and the temperature characteristic of a laser chip and reducing the manufacturing cost of a stem.

To achieve the above object, the present invention provides a semiconductor laser device comprising:

a laser element;

a stem having a block portion on which the laser element is mounted; and a cap attached to the stem so as to cover the block portion, the cap being provided with a cutout portion into which the block portion is partially inserted.

According to the semiconductor laser device of the above-mentioned construction, the cap is provided with the cutout portion into which the block portion is partially inserted, and therefore, the block portion can be enlarged. Thereby, the block portion is easily formed integrally with the stem by forming for example, which leads to cost reduction of manufacturing the stem.

Moreover, enlargement of the block portion improves the heat radiation or heat release of the block portion, so that the temperature of the laser element does not rise during operation. As a result, the operating lifetime and the temperature characteristic of the laser element can be improved.

Moreover, when the block portion is formed of copper for example, the heat release of the block portion is further improved.

In one embodiment of the present invention, the cap is provided with a window at an end of the cap on an opposite side of the stem, the window being glazed with a sealing glass, and a gap between the cutout portion and the block portion is filled up with a thermosetting resin.

According to the semiconductor laser device of the above-mentioned embodiment, the cap is completely sealed up. Moisture does not enter the cap, so that the laser element can be prevented from being deteriorated by moisture.

In one embodiment of the present invention, the cap is provided with a window at an end of the cap on an opposite side of the stem, the window being glazed with a sealing glass, and the cutout portion and the block portion are joined to each other by electric welding.

According to the above-mentioned embodiment, the cap can be perfectly sealed up. Therefore, moisture or the like does not enter the cap, and the laser element can be prevented from being deteriorated by moisture or the like.

In one embodiment of the present invention, the block portion is formed integrally with the stem.

According to the semiconductor laser device of the above-mentioned embodiment, since the stem and the block portion are formed integrally with each other, the manufacturing cost of the stem is reduced.

In one embodiment of the present invention, the block portion is comprised of a high heat conductance material.

According to the above-mentioned embodiment, the heat radiation of the block portion can be further improved.

In one embodiment of the present invention, a length of the block portion in a laser emission direction is from 1.0 millimeter to 1.7 millimeters.

According to the above-mentioned embodiment, the block portion and the stem are formed integrally with each other more easily by forging.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAIDED DESCRIPTION OF THE PREFERRED EMBODIMENTS

Figure 1:
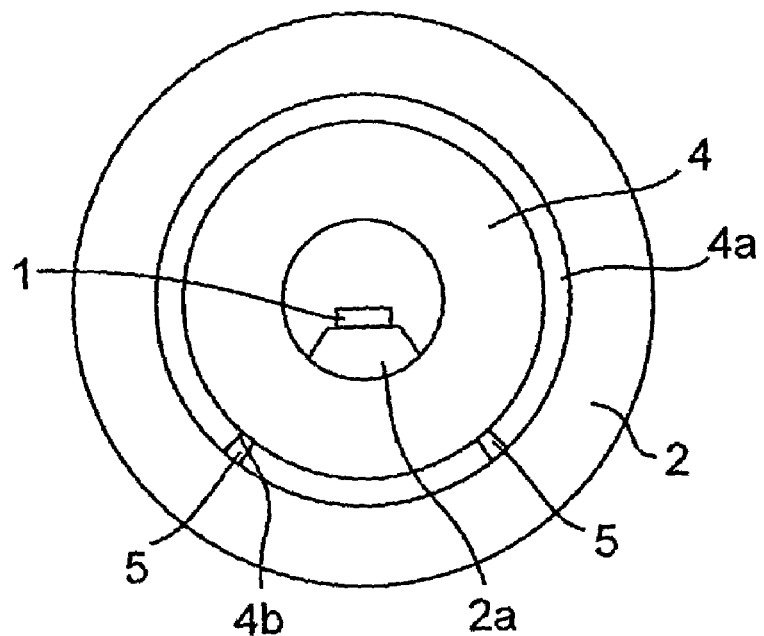
FIG. 1 is a front view of a semiconductor laser device according to one embodiment of the present invention.

The semiconductor laser device of the present invention will be described in detail below on the basis of embodiments shown in the drawings.

Figure 2:
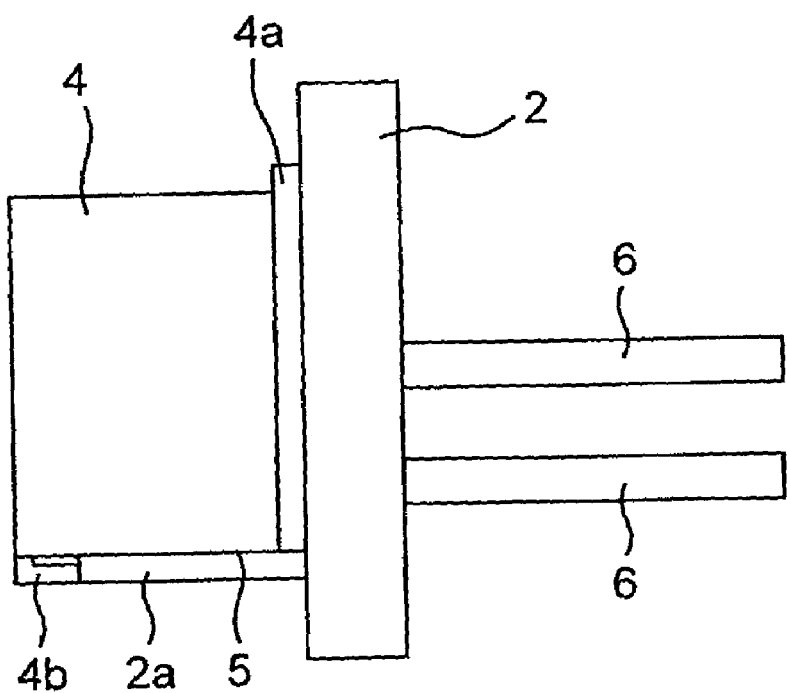
FIG. 2 is a side view of the above semiconductor laser device.

FIG. 1 is a view of a semiconductor laser device of one embodiment of the present invention, viewed from the laser beam emission side. FIG. 2 is the above semiconductor laser device, viewed from a side.

As shown in FIGS. 1 and 2, the semiconductor laser device is provided with a laser chip 1 that serves as a laser element, a stem 2 having a block portion 2a on which this laser chip 1 is mounted, and a closed-end cylindrical a cap 4 that is attached to the stem 2 so as to cover the block portion 2a.

The stem 2 is provided with lead pins 6 located on the opposite side of the cap 4. The stem 2 is produced by forging so as to be integrated with the block portion 2a. Moreover, the stem 2 and block portion 2a are made of a high heat conductance material. The width (length in the horizontal direction in FIG. 1) of the block portion 2a is expanded in the radial outward direction. The laser chip 1 is mounted on an end surface of the block portion 2a which surface is located in the radial inward direction. Therefore, the above-stated end surface of the block portion 2a is flat. Moreover, another end surface of the block portion 2a, which surface is located in the radial outward direction, has a circular arc surface. The length (height) of the block portion 2a in the light-emitting direction is from 1.0 millimeter to 1.7 millimeters.

The cap 4 has a structure in which a portion that interferes with the block portion 2a is cut out. In concrete, a side portion of the cap 4 is provided with a cutout portion 4b into which the block portion 2a is partially inserted. Moreover, an end portion of the cap 4 on the side of the stem 2 is provided with a flange portion 4a having a circular arc. An end surface of the block portion 2a located in the radial outward direction is exposed through the cutout portion 4b of the cap 4. Moreover, a gap between the cap 4 and the block portion 2a in the cutout portion 4b is filled up with a thermosetting resin 5.

Figure 3:
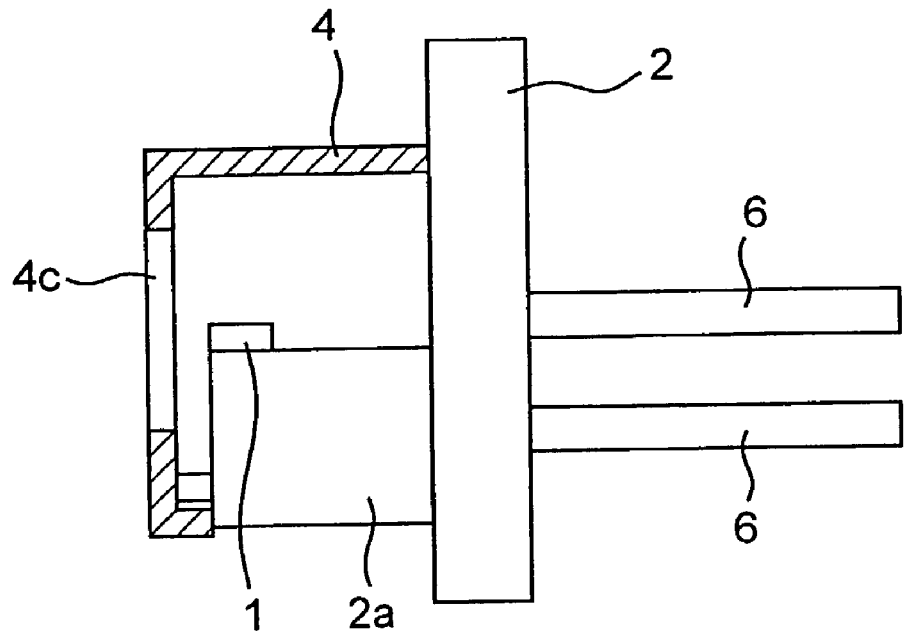
FIG. 3 is a schematic side view of the semiconductor laser device shown partially in cross section.
Figure 4:
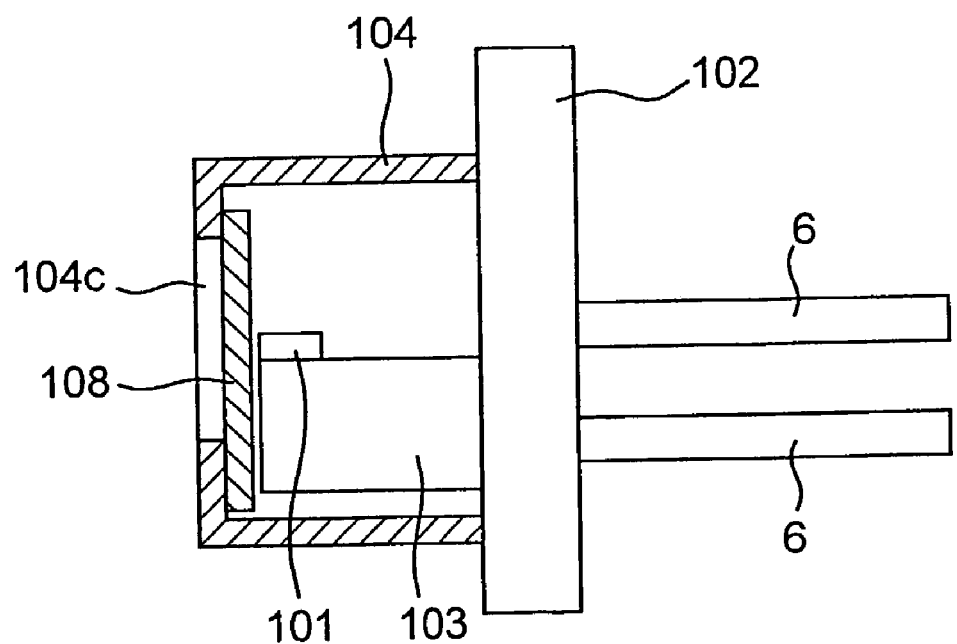
FIG. 4 is a schematic side view of a conventional semiconductor laser device shown partially in cross section.

As shown in FIG. 3, a window 4c is provided at an end portion of the cap 4 that is located opposite to the stem 2. A laser beam emitted from the laser chip 1 passes through the window 4c.

According to the semiconductor laser device of the above-mentioned construction, the cap 4 is provided with the cutout portion 4b into which the block portion 2a is partially inserted. Therefore, the block portion 2a can be enlarged up to a periphery of the flange portion 4a of the cap 4. That is, the length of the block portion 2a can be extended in the radial direction thereof. Since the block portion 2a can be enlarged, the block portion 2a is easily formed integrally with the stem 2 by forging for example. This leads to cost reduction in manufacturing the stem 2.

Moreover, enlargement of the block portion 2a improves the heat radiation of the block portion 2a, so that temperature of the laser chip 1 does not rise during operation. As a result, the operating lifetime and the temperature characteristic of the laser chip 1 can be improved.

Moreover, if the block portion 2a is formed of copper for example, then the heat radiation of the block portion 2a can be further improved.

In the above-mentioned embodiment, the gap between the cap 4 and the block portion 2a in the cutout portion 4b is filled up with the thermosetting resin 5. However, the gap between the cutout portion 4b and the block portion 2a may be filled with a metal by electric welding. This electric welding is preferably used for a narrow gap between the cutout portion 4b and the block portion 2a.

Moreover, a windowpane that serves as a sealing glass is not attached to the window 4c of the cap 4 in the above-mentioned embodiment. However, the windowpane may be used for protecting a laser chip. For example, when the laser chip 1 is deteriorated by humidity or the like, the window pane is attached to the window of the cap, and the cap is attached to the stem. Then, in dry air or nitrogen atmosphere, the gap between the block portion 2a and the cutout portion 4b is filled up with the thermosetting resin.

A fabricating method of the semiconductor laser device according to the present invention will be described below as an example.

First, the laser chip 1 is mounted on the block portion 2a of the stem 2. When mounting the laser chip 1, Indium (In) is used as a brazing material. When the block portion 2a has a submount, the laser chip 1 may be joined to the submount by using the brazing material. The brazing material used at this time may be AuSn. Also, the submount may be joined to the block portion 2a by means of such a metal brazing material as silver paste, In or AuSn.

Thereafter, the laser chip 1 is connected to the lead pins 6 of the stem 2 with Au wires.

Next, the block portion 2a is covered with the cap 4 so that the cap does not interfere with the block portion 2a. This is conducted by adjusting the cap 4 in the direction of rotation. Then, the cap 4 is joined to the stem 2 by electric welding to complete a semiconductor laser device.

As described above, in the semiconductor laser device according to the present invention, the cap is provided with the cutout portion into which the block portion is partially inserted, and thereby the block portion can be enlarged. Therefore, the block portion is easily formed integrally with the stem by forging for example, which reduces the manufacturing cost of the stem.

Moreover, the heat radiation of the block portion is improved by enlargement of the block portion. Therefore, the temperature of the laser element does not rise during operation, and the lifetime and the temperature characteristic of the laser element can be improved.

Moreover, the semiconductor laser device according to the present invention allows the block portion to be formed integrally with the stem, and thereby the semiconductor laser device is superior in mass productivity. At the same time the stem can be produced in compact and have good heat release.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A semiconductor laser device comprising:
   a laser element;
   a high heat conductance stem having a block portion on which the laser element is mounted; and a cap attached to the stem to cover the block portion, the cap being provided with a cutout portion that prevents the cap from interfering with the block portion.

2. The semiconductor laser device as claimed in claim 1, wherein:
the cap is provided with a window at an end of the cap which is opposite the stem,
the window is glazed with a sealing glass, and
a gap between the cutout portion and the block portion is substantially filled with a thermosetting resin.

3. The semiconductor laser device as claimed in claim 1, wherein:
the cap is provided with a window at an end of the cap which is opposite the stem,
the window is glazed with a sealing glass, and
the cutout portion and the block portion are joined to each other by electric welding.

4. The semiconductor laser device as claimed in claim 1, wherein the block portion is formed integrally with the stem.

5. The semiconductor laser device as claimed in claim 4, wherein a length of the block portion in a laser emission direction is from 1.0 millimeter to 1.7 millimeters.

6. The semiconductor laser device as claimed in claim 1, wherein the block portion is comprised of a high heat conductance material.

7. A semiconductor laser device comprising:
a laser element;
a stem having a block portion on which the laser element is mounted; and
a cap attached to the stem to cover the block portion, the cap being provided with a cutout portion that prevents the cap from interfering with the block portion,
wherein the stem is formed of a thermally conductive material.

8. The semiconductor laser device as claimed in claim 7, wherein the block portion is integrally formed with the stem.

9. The semiconductor laser device as claimed in claim 7, wherein the cap is substantially cylindrical.

10. A semiconductor laser device comprising:
a laser element;
a stem having a block portion on which the laser element is mounted, the block portion having a width that expands in a radially outward direction; and
a cap attached to the stem to cover the block portion, the cap being provided with a cutout portion into which the block portion is partially inserted,
wherein the stem is formed of a thermally conductive material.

* * * * *